US006977976B1

(12) United States Patent
Birkett et al.

(10) Patent No.: US 6,977,976 B1
(45) Date of Patent: Dec. 20, 2005

(54) COMPLEX FILTERING/AGC RADIO RECEIVER ARCHITECTURE FOR LOW-IF OR ZERO-IF

(75) Inventors: Neil Birkett, Richmond (CA); James Cherry, Ottawa (CA); William Martin Snelgrove, Toronto (CA); Florinel Balteanu, Ottawa (CA)

(73) Assignee: Skyworks Solutions, Inc., Irvine, CA (US)

( * ) Notice: Subject to any disclaimer, the term of this patent is extended or adjusted under 35 U.S.C. 154(b) by 851 days.

(21) Appl. No.: 09/675,513

(22) Filed: Sep. 29, 2000

(30) Foreign Application Priority Data

Nov. 15, 1999 (CA) .................................. 2289823

(51) Int. Cl.[7] ............................................. H04L 27/08
(52) U.S. Cl. ................... 375/345; 375/350; 455/234.1; 455/245.2; 455/296
(58) Field of Search ............................... 375/345, 344, 375/346, 349, 350, 285; 455/232.1, 234.1, 455/245.1, 245.2, 251.1, 283, 296, 278.1, 455/250.1, 226.1, 226.2, 63.1, 67.11, 67.13

(56) References Cited

U.S. PATENT DOCUMENTS

| | | | | |
|---|---|---|---|---|
| 4,543,546 A | * | 9/1985 | Hariharan | 333/173 |
| 5,086,437 A | * | 2/1992 | Tomita | 375/345 |
| 5,896,562 A | * | 4/1999 | Heinonen | 455/76 |
| 6,009,317 A | * | 12/1999 | Wynn | 455/296 |
| 6,233,227 B1 | * | 5/2001 | Izumi | 370/280 |
| 6,324,387 B1 | * | 11/2001 | Kamgar et al. | 455/234.1 |

OTHER PUBLICATIONS

IEEE Journal of Solid State Circuits, vol. 30, No. 12, Dec., 1995, pp. 1399-1410, *Direct-Conversion Radio Transceivers for Digital Communications*—ABIDI, Asad A.
IEEE Transactions on Circuits and Systems—II: Analog and Digital Signal Processing, vol. 45, No. 3, Mar., 1998, pp 269-282 *Low-IF Topologies for High-Performance Analog Front Ends of Fully Integrated Receivers* CROLS, Jan & Steyaert, Michiel S.J.

* cited by examiner

*Primary Examiner*—Jean B. Corrielus
(74) *Attorney, Agent, or Firm*—Gardner Groff, P.C.

(57) ABSTRACT

A low power IF strip architecture suitable for Zero-IF (ZIF) or low-IF (LIF) radio receivers for filtering and amplifying a received signal. The apparatus includes a plurality of sequentially connected complex filter/amplifier stages. Each stage includes a complex filter having one or more poles and an automatic gain controlled amplifier (AGC). Each AGC may be feedback or feedforward with fixed minimum and maximum gains. Each stage further includes a control circuit that produces a gain control signal for controlling the amplifier gain within the fixed minimum and maximum gains as a function of a projected amplitude level. The received signal passes through multiple stages of filtering and controlled amplification to attenuate the interfering signal and amplify the desired signal. This is done at a restricted level in each stage such that the circuits in the stages operate at efficient power saving levels. The individual gain control signals from each stage are summed in a received signal strength indicator to provide the overall gain of the apparatus. The overall gain when taken with the amplitude of the apparatus output signal determines the original strength of the desired received signal.

27 Claims, 7 Drawing Sheets

COMPLEX FILTERING/AGC RADIO RECEIVER ARCHITECTURE FOR LOW-IF OR ZERO-IF

FIELD OF THE INVENTION

The invention relates generally to circuitry for filtering and amplifying signals, and more particularly to a complex Filtering/Automatic Gain Control architecture for zero-IF or low-IF radio receivers.

BACKGROUND OF THE INVENTION

Present day RF radio receivers must be capable of detecting and demodulating RF signals in which the desired information signal is often much weaker than existing interfering signal. Recently, receivers which directly convert the RF signal to a much lower frequency have been developed. The RF signal is down-converted to a zero-IF or low-IF intermediate frequency where analog and/or digital signal processing is more efficient. Present day radio receivers typically employ real filters to filter out interfering signals, and amplifiers to increase the level of the desired signal. If real filters are used in a LIF path they have the disadvantage of not differentiating between negative frequencies and positive frequencies, hence a high performance image reject mixer is typically used to separate the positive/negative frequencies. In addition, where the frequency of the interfering signal is close to the frequency of the desired signal in a LIF architecture, a substantial number of filter poles are required to filter out the interfering signals and the overall amplifier circuit is such that considerable power is required to amplify the desired signal to an appropriate level for demodulation. In addition, DC offsets caused by both circuit imperfections and characteristics inherent in certain forms of modulation must be removed since they can be several orders of magnitude larger than the desired signal and can degrade the performance of the final demodulator circuit.

Therefore, there is a need for a simpler architecture for enhancing the gain performance and removing DC offsets while minimizing power consumption.

SUMMARY OF THE INVENTION

In accordance with an aspect of the present invention, there is provided an apparatus for filtering and amplifying a received signal that includes a desired signal portion embedded in an interfering signal portion. The apparatus includes a plurality of complex filter/amplifier stages connected in sequence. Each of the stages has a complex filter for attenuating an interfering portion of the received signal relative to the desired portion of a signal received by the complex filter, a controlled amplifier which has set minimum gain $K_{min}$ and maximum gain $K_{max}$ for amplifying the desired signal portion and the interfering signal portion of the signal received from the complex filter, where $K_{min}$ may be negative, and a control circuit. The control circuit controls the amplifier gain K where $K_{min} \leq K \leq K_{max}$ such that the controlled amplifier seeks to generate the desired signal of the signal received from the complex filter, which has a projected amplitude level. The apparatus provides an output of the last state of the complex filter/amplifier as the desired signal of the received signal at a predetermined signal level at the apparatus output as a result of a combined gain of the controlled amplifiers of the plurality of the complex filter/amplifier stages.

In accordance with a further aspect of the present invention, there is provided an apparatus for filtering and amplifying a complex in-phase I and quadrature phase Q received signals. The apparatus includes a plurality of sequentially connected complex filter/amplifier stages, each stage having: complex filter means for attenuating an interfering portion relative to a desired portion of signals received by the complex filter means; and controlled amplifier means having set minimum gain $K_{min}$ and maximum gain $K_{max}$ for amplifying the signals received from the complex filter means, the signal received from the complex filter means including an in-phase I signal and a quadrature phase Q signal. The controlled amplifier means includes: a first variable gain amplifier for amplifying the in-phase I signal; and a second variable gain amplifier for amplifying the quadrature phase Q signal. The apparatus includes control means for generating a gain control signal for controlling a gain K of the first and second amplifiers where $K_{min} \leq K \leq K_{max}$ such that the controlled amplifiers seek to generate output signals having a projected amplitude level. The control means includes: a first rectifier for receiving the output of the first variable amplifier to provide a first rectified signal; a second rectifier for receiving the output of the second variable amplifier to provide a second rectified signal; summing means for adding the first and the second rectified signals; and error amplifier means having a first input coupled to the summing means and a second input coupled to a projected amplitude level signal for producing the gain control signal.

In accordance with a further aspect of the present invention, there is provided an apparatus for filtering and amplifying a complex in-phase I and quadrature phase Q received signals. The apparatus includes a plurality of sequentially connected complex filter/amplifier stages, each stage having: complex filter means for attenuating an interfering portion relative to a desired portion of signals received by the complex filter means; and controlled amplifier means having set minimum gain $K_{min}$ and maximum gain $K_{max}$ for amplifying the signals received from the complex filter means, the signal received from the complex filter means including an in-phase I signal and a quadrature phase Q signal. The controlled amplifier means includes: a first variable gain amplifier for amplifying the in-phase I signal; and a second variable gain amplifier for amplifying the quadrature phase Q signal. The apparatus includes control means for generating a gain control signal for controlling a gain K of the first and second amplifiers where $K_{min} \leq K \leq K_{max}$ such that the controlled amplifiers seek to generate output signals having a projected amplitude level. The control means includes: a first rectifier for receiving the input of the first variable amplifier to provide a first rectified signal; a second rectifier for receiving the input of the second variable amplifier to provide a second rectified signal; summing means for adding the first and the second rectified signals; and error amplifier means having a first input coupled to the summing means and a second input coupled to a projected amplitude level signal for producing the gain control signal.

In accordance with a further aspect of the present invention, there is provided an apparatus for filtering and amplifying a complex in-phase I and quadrature phase Q received signals. The apparatus includes a plurality of sequentially connected complex filter/amplifier stages, each stage having: complex filter means for attenuating an interfering portion relative to a desired portion of signals received by the complex filter means; and controlled amplifier means having set minimum gain $K_{min}$ and maximum gain $K_{max}$ for amplifying the signals received from the complex filter means, the signal received from the complex filter means including an in-phase I signal and a quadrature phase Q signal. The controlled amplifier means includes: a first variable gain amplifier for amplifying the in-phase I signal; and a second variable gain amplifier for amplifying the quadrature phase Q signal. The apparatus includes control means for generating a gain control signal for controlling a gain K of the first and second amplifiers where $K_{min} \leq K \leq K_{max}$ such that the controlled amplifiers seek to generate output signals having a projected amplitude level. The apparatus includes a received signal strength indicator having: gain summation means for receiving the gain control signal from each of the complex filter/amplifier stages for computing the overall gain of the apparatus; means for detecting and amplitude of the apparatus output signal; and means coupled to the gain summation means and the detector means for indicating the strength of a desired signal received by the apparatus.

The present invention is particularly advantageous in that the apparatus is capable of providing an overall output signal at a predetermined amplitude level within a restricted dynamic range from input signals having a wide variety of signal strengths and at the same time permits for the use of low power consuming subsequent circuits. This is achieved in apparatus that itself draws very low power. The apparatus operates effectively on received signals in the IF band that are low-IF or zero-IF.

In accordance with another aspect of this invention, the received signal is made up of complex in-phase I and quadrature phase Q signals. The complex filter may be multipolar or may be one or more single pole complex filters connected in series. The controlled amplifier has a first variable gain amplifier for amplifying the in-phase I signal and a second variable gain amplifier for amplifying the quadrature phase Q signal. The control circuit generates a gain control signal which is a function of the outputs or the inputs of the amplifiers as well as a function of a projected amplitude level.

In accordance with a further aspect of this invention, the control circuit may include a first and a second rectifier for receiving the inputs of the first and second variable amplifiers respectively or the outputs of the first and second variable amplifiers respectively to provide first and second rectified signals. The rectified signals are added in a summing circuit and fed to an error amplifier where the summed signal is compared to a projected amplitude level signal for producing the gain control signal used to control the gain of the amplifiers.

With regard to another aspect of this invention, the apparatus may further include a received signal strength indicator which has a gain summation circuit for receiving the gain control signal from each of the complex filter/amplifier stages to compute the overall gain of the apparatus and a detector to detect the amplitude of the apparatus overall output signal for determining the strength of a desired signal received by the apparatus.

Other aspects and advantages of the invention, as well as the structure and operation of various embodiments of the invention, will become apparent to those ordinarily skilled in the art upon review of the following description of the invention in conjunction with the accompanying drawings.

BRIEF DESCRIPTION OF THE DRAWINGS

The invention will be described with reference to the accompanying drawings, wherein.

DETAILED DESCRIPTION OF THE INVENTION

Figure 1:
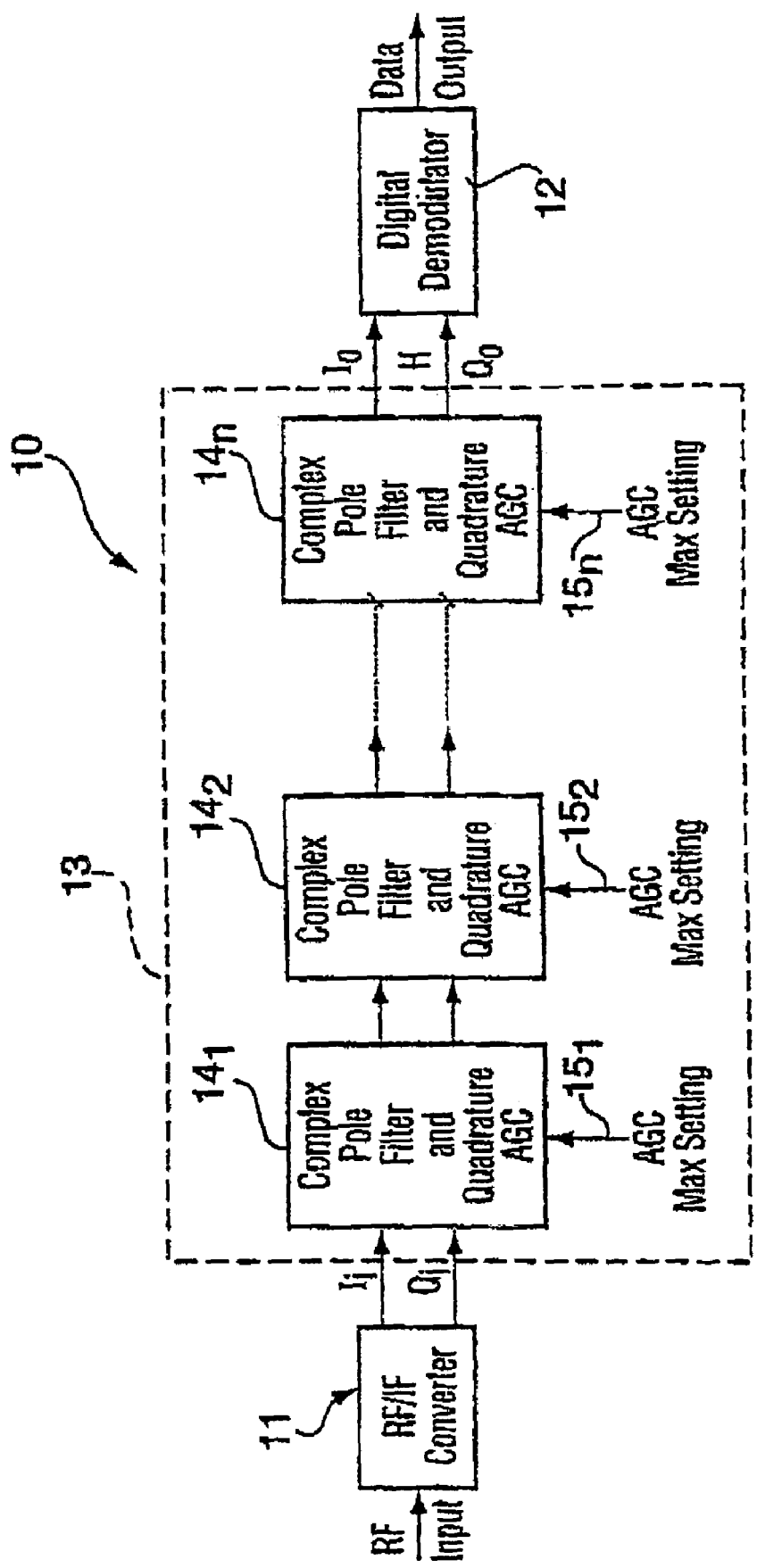
FIG. 1 schematically illustrates the invention.

Though the present invention is described in conjunction with FIG. 1 within the environment of an RF radio receiver, it may also be used in other applications where circuitry that has very low power consumption levels is required. An RF radio receiver 10 includes, at its front end, an RF/IF down converter 11 for converting the input RF signal to low-IF (LIF) or zero-IF (ZIF) in-phase $I_i$ and quadrature $Q_i$ signals. The RF radio receiver further includes a digital demodulator 12 at its back end for digitizing the amplified in-phase $I_o$ and quadrature $Q_o$ signals and demodulating the digitized signals to provide at its output the data from the input RF signal. In most circumstances, the quadrature $I_i$ and $Q_i$ signals cannot be applied directly to the digital demodulator 12. The desired signal, whether it is too small or too great for the demodulator 12 is embedded in an interfering signal. The desired signal is usually very small relative to the interfering signal, the interfering signal being as high as 60 db greater than the desired signal. In order to be able to detect and demodulate the desired signal portion of the input signal, the amplitude of the desired signal must be made greater than the interfering signal, and the amplitude of the desired signal must also be at a level that can be efficiently digitized and demodulated, this is carried out by passing the input signals through bandpass filters and amplifiers.

FIG. 1 schematically illustrates a novel cascaded structure 13, in accordance with the present invention, for filtering and amplifying the in-phase $I_i$ and quadrature $Q_i$ input signals to produce in-phase $I_o$ and quadrature $Q_o$ output signals having which can be efficiently digitized and demodulated. In order to be able to use an efficient analog to digital converter (ADC), it is advantageous that the overall in-phase $I_o$ and quadrature $Q_O$ output signals be produced at a predetermined level H within a restricted dynamic range whether the desired portion of the input signal is initially far below or even above the predetermined level H. The more restricted the dynamic range, the smaller the number of bits required in an ADC to digitize the signal, this reduces the power requirements for the ADC.

The cascaded structure 13 includes a series of complex filter/amplifier stages $14_1, 14_2, \ldots 14_n$ which each in turn independently filter and amplify the complex signal until the desired portion of the complex signal achieves a predetermined amplitude level H that falls within the desired restricted dynamic range and is relatively greater than the interfering signal. Though the stages $14_1, 14_2, \ldots 14_n$, are described in terms of a filter/amplifier sequence of components, it is understood that the sequence of components could equally be amplifier/filter in all embodiments of the present invention. The filter in each stage $14_1, 14_2, \ldots 14_n$ may be a single or multiple pole filter and the amplifiers in stages $14_1, 14_2, \ldots 14_n$ are amplitude gain controlled amplifiers which each exhibit an individual gain range having a minimum gain which may be positive or negative and a maximum positive gain. The attenuation of the interfering signal by the filters relative to the desired signal may be distributed equally or unequally over the stages $14_1, 14_2, \ldots 14_n$ and the gain range for each stage $14_1, 14_2, \ldots 14_n$ may also differ from stage to stage. In addition, AGC settings $15_1, 15_2, \ldots 15_n$ are applied to the amplifiers in stages $14_1, 14_2, \ldots 14_n$ respectively to control the gain of each amplifier such that the amplitude of the signal at the output of each respective amplifier will tend towards a projected signal level as fixed by the respective AGC setting $15_1, 15_2, \ldots 15_n$. It may occur that one or more amplifiers are driven to operate at its minimum or maximum gain without achieving the projected output signal level called for by AGC setting $15_1, 15_2, \ldots 15_n$ at the particular amplifier in that stage.

In operation, the complex filter/amplifier stages $14_1, 14_2, \ldots 14_n$ act independently of one another and the stages act sequentially on the input signal so as to produce a desired output signal having a predetermined signal level H falling within the restricted dynamic range required at the output. The signal level H is achieved in the last stage $14_n$ by controlling the amplifier within the stage $14_n$ by the AGC setting $15_n$ The AGC setting $15_1, 15_2, \ldots 15_n$ are preset at specific levels and represent the projected amplitude level desired at the output of the respective amplifiers. AGC setting $15_1, 15_2, \ldots 15_n$ are used to control the gain of the respective amplifiers within their respective gain ranges. The number of stages $14_1, 14_2, \ldots 14_n$ in the cascaded structure 13 and the maximum of the gain range for each amplifier is preset in order to obtain the total gain required over the entire cascaded structure 13 to accommodate the variety of desired input signals levels with which the receiver is expected to function properly. The gain ranges or the gain range maximums may be substantially the same, however this will not usually be the case. Each amplifier gain range is preferably selected such that the amplifiers will operate efficiently minimizing power consumption.

Initially, at the input to the RF radio receiver, the desired input signal is relatively much smaller than the interfering signals. Each stage $14_1, 14_2, \ldots 14_n$ attenuates the interference signals using a complex filter having one or more poles. The signal is then amplified by an AGC which amplifies both the desired signal as well as the interfering signal. As the signal passes through subsequent stages, the desired signal becomes larger relative to the interfering signal since both are amplified but only the interfering signal is attenuated by the filter. Thus, in the last stages, the desired signal becomes the dominant signal since the interfering signal is being attenuated to towards zero.

As an example, a five stage filter/amplifier structure 13 may have gain ranges for the five stages $14_1, 14_2, \ldots 14_5$, of +5 to –5, +5 to –5, +20 to –5, +20 to –5, and +15 to –5 respectively in order to accommodate the range of signals that it is to detect.

In one scenario, it might be found that a five stage structure 13 is required to detect a desired signal that is 50 db below the level H required for it to be digitized and also about 40 db below the interfering signal. In such a case, the AGC setting $15_1, 15_2$ will place a gain demand on the first two stages that are very low, say in the order of 2 and 6 db since the interfering signal is high, such that the filters attenuate the interfering signals significantly while the signals are not being amplified significantly by the amplifiers in these early stages. At the third stage, with desired signal and the interfering signal being relatively equal, the AGC setting $15_3$ may be set at a level which demands a gain of the amplifier greater than its gain range maximum of 20 db. Thus at this stage the amplifier signal gain will be its maximum while its output is lower than that requested. The fourth stage may again have a high AGC setting $15_4$, which may demand a gain in the order of 14 db which would be below its maximum of 20 db. Going into the final stage, the AGC setting $15_5$ will be set to achieve the desired amplifier output level H. Since the overall gain of the desired signal is the sum of the individual gains, it would be 42 db to this point, and the gain demand on the last amplifier will be 8 db which is below its maximum of 15 db.

In a second scenario taken at the other extreme of possible input signals for the same five stage structure 13, the desired input signal may already be greater than level H required for it to be digitized say for instance about 6 db, and at the same time somewhat smaller than the interfering signal. In such a case, the AGC settings $15_1, 15_2$ will demand large negative gains of the amplifiers in the first two stages $14_1, 14_2$, to get the signal level down. However since the amplifiers have a lower limit of –5 db for instance, both the desired signal and the interfering signals will be attenuated by the amplifiers to that limit while the interfering signals will also be attenuated by the filters. It will now be found that the desired signal is below the required output level H by about 4 db. In the third to fifth stages $14_3, 14_4$ and $14_5$, the gain demanded by the AGC settings $15_3, 15_4$, and $15_5$ will be small since the desired signal is only 4 db below the required output level.

Figure 2:
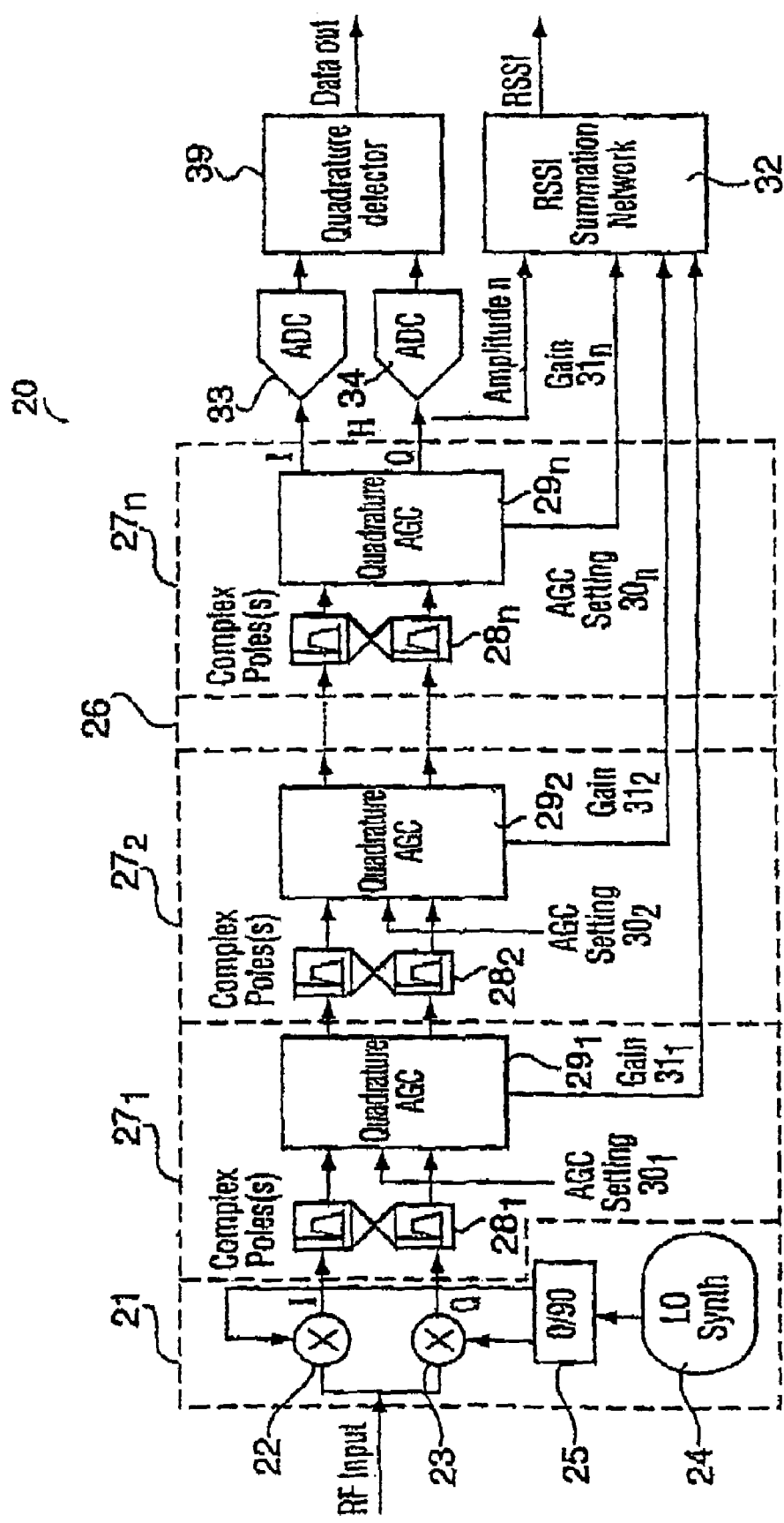
FIG. 2 illustrates an embodiment of the present invention.

One embodiment of the complex filtering/AGC IF architecture in accordance with the present invention is illustrated in FIG. 2 as part of an RF radio receiver 20. The front end of the receiver 20 includes a quadrature down converter 21 having a pair of mixers 22 and 23 to which the input RF is applied. A synthetic local oscillator 24 with the phase splitter 25 provides second input signals that are at a predetermined frequency, but 90° out of phase, to the mixers 22 and 23 in order to generate quadrature I and Q signals at a low or zero intermediated frequency (LIF or ZIF).

The complex filter/amplifier apparatus 26 comprises a plurality of filter/amplifier stages $27_1, 27_2, \ldots 27_n$ connected in series such that the output of one stage is the input for the next stage. Each stage $27_1, 27_2, \ldots 27_n$ includes a complex filter $28_1, 28_2, \ldots 28_n$ which may have one or more poles as well as an automatic gain controlled amplifier (AGC) $29_1, 29_2, \ldots 29_n$. The AGC's $29_1, 29_2, \ldots 29_n$ are each fed a level control voltage termed the AGC settings $30_1, 30_2, \ldots 30_n$. Though each stage $27_1, 27_2, \ldots 27_n$ is shown to include a complex filter $28_1, 28_2, \ldots 28_n$ followed by an AGC $29_1, 29_2, \ldots 29_n$, the order of these components may be reversed in each stage $27_1, 27_2, \ldots 27_n$.

The output of the last stage $27_n$ is fed through two analog to digital converters (ADC) 33, 34 and a quadrature detector 39 or digital demodulator which provides the data from the original input data signal.

In addition, a signal representing the actual gains $31_1, 31_2, 31_n$ of each AGC $29_1, 29_2, \ldots 29_n$ is directed to a received signal strength indicator (RSSI) 32 in order to determine the actual input data signal strength. The input data signal strength is estimated by the RSSI 32 from the sum of the actual gains $31_1, 31_2, \ldots 31_n$ which provides the overall gain of the complex filter/amplifier apparatus 26 and the measured signal level H at the output of stage $27_n$. When the gains $31_1, 31_2, \ldots 31_n$ of the AGC's $29_1, 29_2, \ldots 29_n$ are controlled to provide an output signal from stage $27n$ that has a relatively constant signal level H regardless of the desired signal level at the input of stage $27_1$, then the signal level H is known to be relatively constant and need not be measured to determine the input data signal strength. The received signal strength indicator 32 output is normally used to trigger the processing of a received signal by the radio receiver. However, its other applications could include notifying the base station that its signal requires boosting for the proper operation of the radio system.

Figure 3:
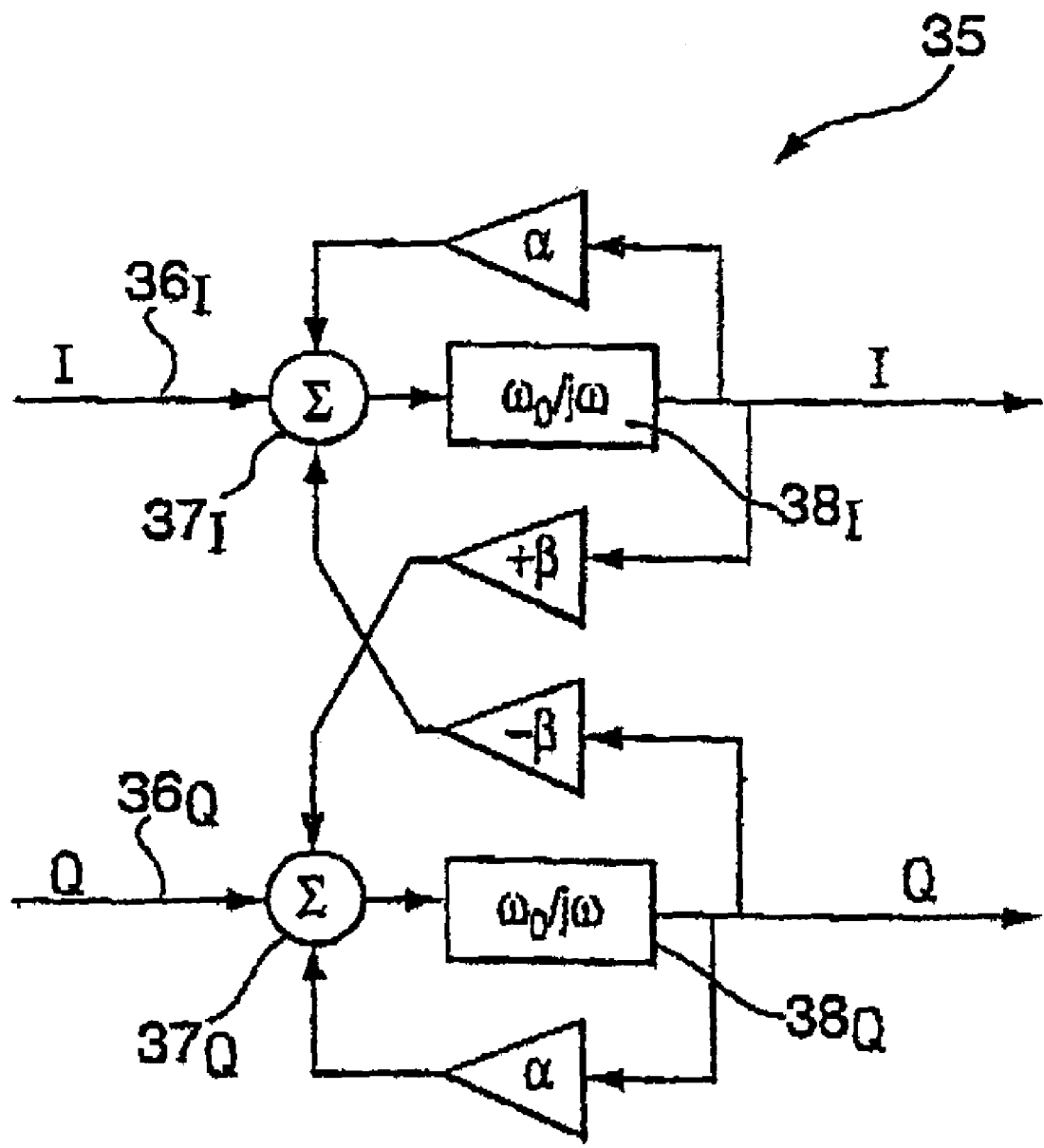
FIG. 3 illustrates a complex single pole filter which may be used with the present invention.

An embodiment of a complex filter $28_1, 28_2, \ldots 28_n$ is illustrated in FIG. 3. The complex filter 35 includes a channel 36, for the in-phase input I and a channel $36_Q$ for the quadrature phase input Q. Included in channels $36_I$ and $36_Q$ are adders $37_I$ and $37_Q$ and integrators $38_I$ and $38_Q$ respectively. In addition to the in-phase signal I and quadrature signal Q being applied to the adders $37_I$ and $37_Q$ respectively, a feedback with coefficient $\alpha$ which may be any real number is applied to each adder $37_I$ and $37_Q$ respectively. As well, a feedback with negative coefficient $\beta$ is applied from the output of integrator $38_Q$ to adder $37_I$ while a feedback with positive coefficient $\beta$ is applied from the output of integrator $38_I$ to adder $37_Q$. Coefficient $\beta$ may also be any real number. The selection of $\alpha$, $\beta$ and $\omega_o$ will determine the bandwidth and centre frequency of the filter 35. Also, depending on the values of $\alpha$, $\beta$ and $\omega_o$ the positive and negative frequencies will experience different attenuations which is desired for an LIF device.

Complex filters are particularly advantageous since $\alpha$, $\beta$ and $\omega_o$ may be varied to vary the centre frequency of the filter while the width of the bandpass about the varied centre frequency can remain the same without changing the number of poles in the filter. As a result, a programmable IF receiver can be designed to switch between IF frequencies.

For a ZIF device, coefficient $\beta$ goes to 0 as the frequency goes to zero and the cross-coupled coefficients $\beta$ thus have no effect. In complex filters, the number of poles required to attenuate a signal at a frequency of x Hz away from the centre frequency is independent of the centre frequency while in real filters, the number of poles required to attenuate a signal at a frequency of x Hz away from the centre frequency is dependent on the centre frequency and will always be greater then that required using complex filters except in the case where the centre frequency is zero in which case it is a real filter.

Multipolar complex filters having two or more poles may comprise two or more filters of the type described with reference to FIG. 3 connected in series.

Embodiments of the AGC's $29_1, 29_2, \ldots 29_n$ are illustrated in FIGS. 4a, 4b, 5a and 5b. Fast quadrature feedback AGC circuits using differential signalling will be described with reference to FIGS. 4a and 4b and fast quadrature feedforward AGC circuits using differential signalling will be described with reference to FIGS. 5a and 5b.

Figure 4A:
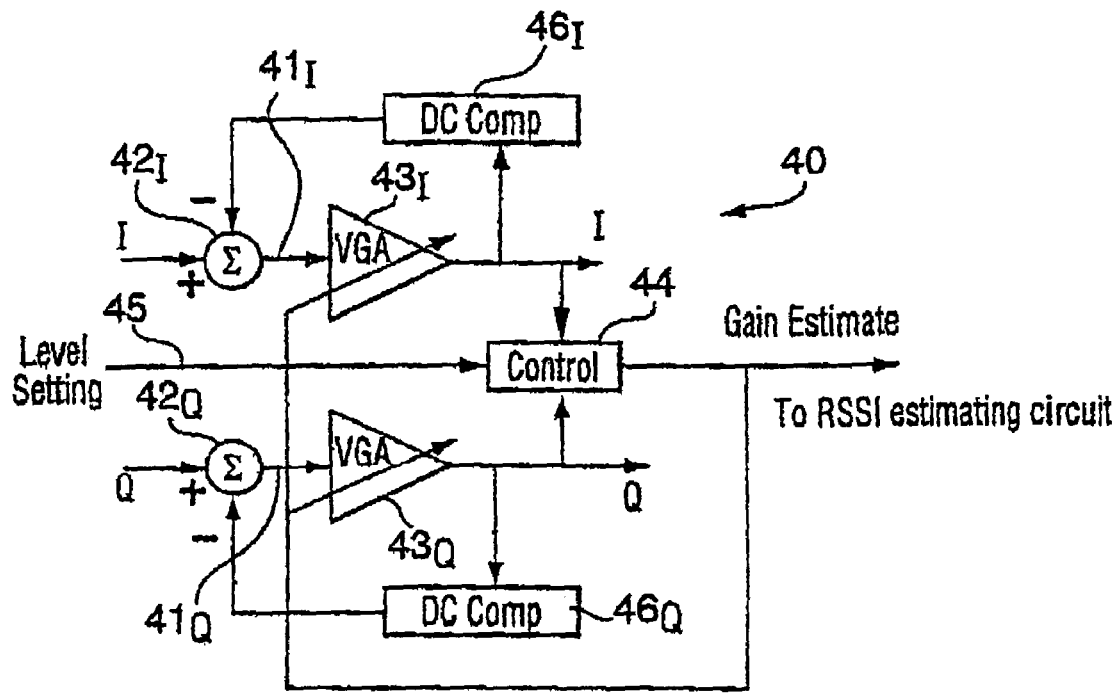
FIG. 4a illustrates a quadrature feedback AGC circuit in accordance with the present invention having DC feedback compensation.

The feedback AGC 40 illustrated in FIG. 4a comprises a pair of channels $41_I$ and $41_Q$ for the in-phase signal I and the quadrature signal Q respectively. Adders $42_I$ and $42_Q$ and variable gain amplifiers $43_I$, and $43_Q$ are connected in series in channels $41_I$ and $41_Q$ respectively. The in-phase signal I is applied to one input of the adder 421, while the quadrature phase signal Q is applied to one input of adder $42_Q$. The gain of VGA's $43_I$ and $43_Q$ is controlled by a control circuit 44 which has inputs connected to the outputs of VGA's $43_I$ and $43_Q$ to detect the amplitude level of these signals and which has a further input connected to a level setting signal 45 to determine the projected signal levels at the output of the VGA's $43_I$ and $43_Q$. The control circuit 44 output is connected to the VGA's $43_I$ and $43_Q$ to control their gains as a function of the difference between the actual and the projected output amplitude levels. The gain may be positive or negative depending on whether the actual signal level is lower or higher respectively than the projected signal level. In addition, the amplifier gain variability is limited to a narrow range which may prevent the signal from being amplified to the projected signal level, but also prevents distortion in low power consumption amplifiers. VGA's $43_I$ and $43_Q$ may be linearly or digitally programmable. Digitally programmable VGA's generally consume less power and are therefore preferred.

Figure 5A:
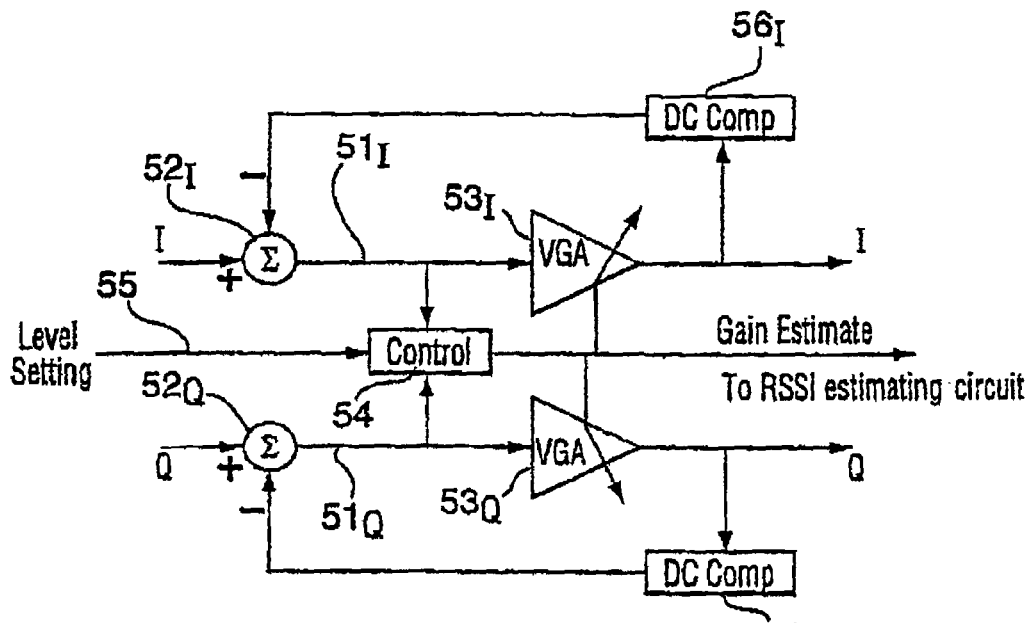
FIG. 5a illustrates a quadrature feedforward AGC circuit in accordance with the present invention having DC feedback compensation.

The feedforward AGC 50 illustrated in FIG. 5a comprises a pair of channels $51_I$ and $51_Q$ for the in-phase signal I and the quadrature signal Q respectively. Adders $52_I$ and $52_Q$ and variable gain amplifiers $53_I$ and $53_Q$ are connected in series in channels $51_I$ and $51_Q$ respectively. The in-phase signal I is applied to one input of the adder $52_I$, while the quadrature phase signal Q is applied to one input of adder $52_Q$. The gain of VGA's $53_I$ and $53_Q$ is controlled by a control circuit 54 which has inputs connected to outputs of adders $52_I$ and $52_Q$ to detect the amplitude level of the input signals to VGA's $53_I$ and $53_Q$ and which has a further input connected to a level setting signal 55 to determine the projected signal level at the output of the VGA's $53_I$ and $53_Q$. The control circuit 54 output is connected to the VGA's $53_I$ and $53_Q$ to control their gains as a function of the difference between the actual input and the projected output amplitude levels. The gain may be positive or negative depending on whether the actual signal level is lower or higher respectively than the projected signal level. In addition, the amplifier gain variability is limited to a narrow range which may prevent the signal from being amplified to the projected signal level, but also prevents distortion in low power consumption amplifiers. Once again, VGA's $53_I$ and $53_Q$ may be linearly or digitally programmable. Digitally programmable VGA's generally consume less power and are therefore preferred.

In addition, CD compensation circuits may be added to the VGA's in order to remove the dc offset. This may done either by using a feedback circuit as illustrated in FIGS. 4a and 5a or by using a feedforward circuit as illustrated in FIGS. 4b and 5b.

The feedback DC compensation circuits $46_I$ and $46_Q$ in FIG. 4a detect the dc output of VGA's $43_I$ and $43_Q$ and feed back a negative voltage to adders $42_I$ and $42_Q$ in order to remove the dc offset on the input signal before the controller 44 estimates the input signal ac levels. The DC compensation circuits $56_I$ and $56_Q$ in FIG. 5a detect the dc output of VGA's $53_I$ and $53_Q$ and feed back a negative voltage to adders $52_I$ and $52_Q$ in order to remove the dc offset on the input signal before the controller 54 estimates the input signal ac levels. Using the above feedforward control circuit 54, the inclusion of DC feedback will not make the AGC circuit unstable since the dc gain will always be less than unity.

Figure 4B:
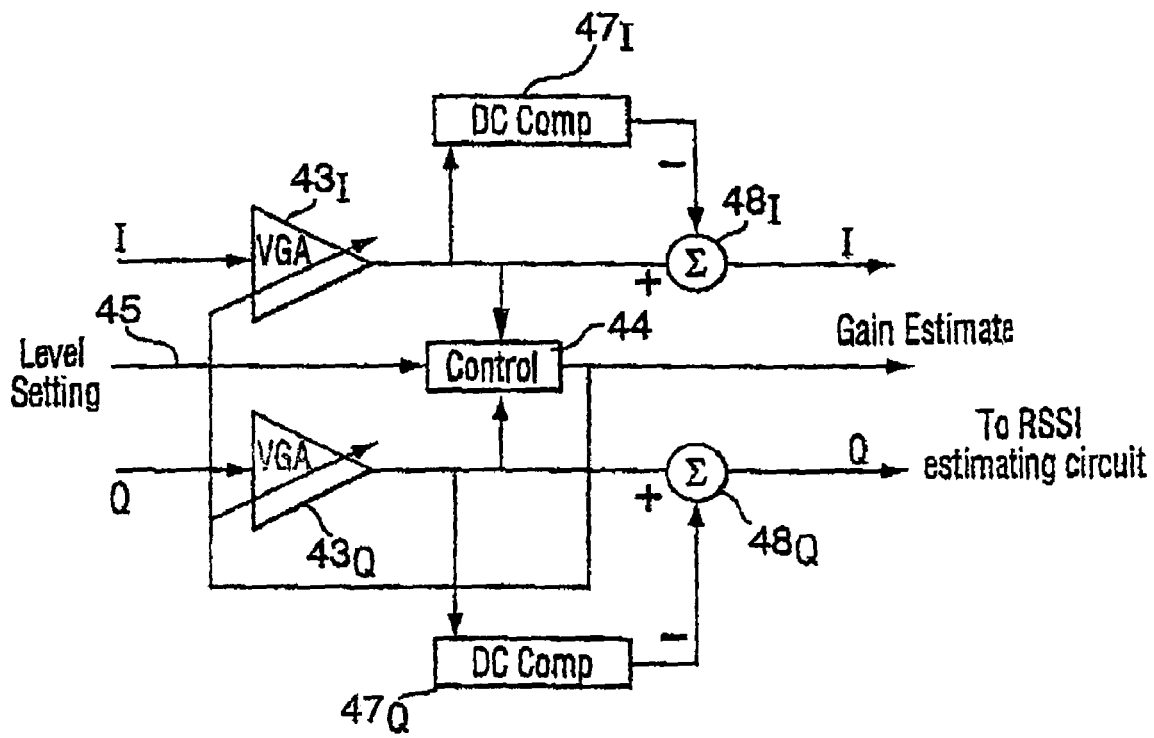
FIG. 4b illustrates a quadrature feedback AGC circuit in accordance with the present invention having DC feedforward compensation.
Figure 5B:
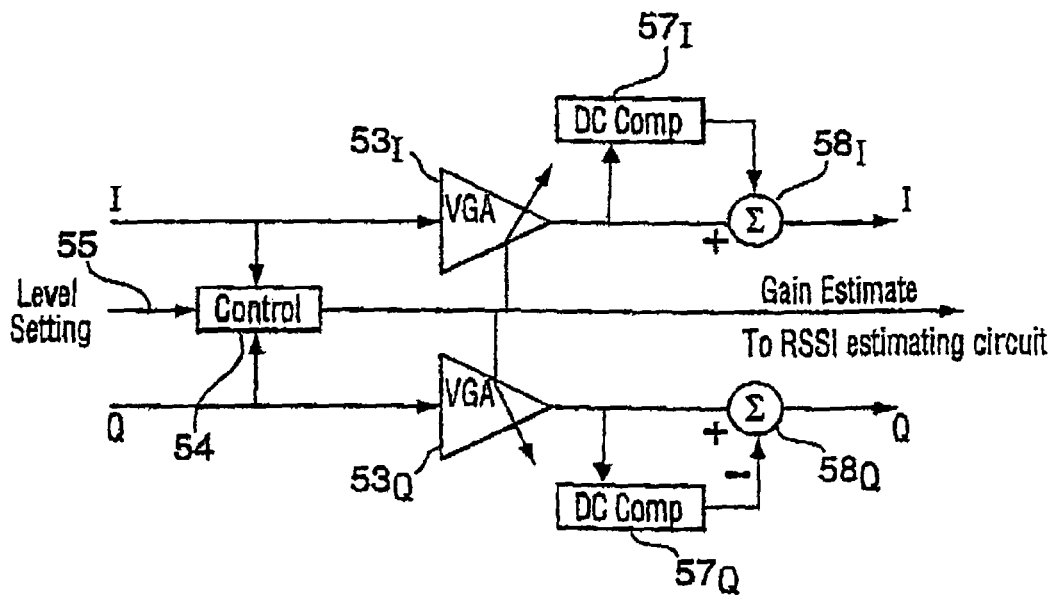
FIG. 5b illustrates a quadrature feedforward AGC circuit in accordance with the present invention having DC feedforward compensation.

The feedforward DC compensation circuits $47_I$ and $47_Q$ in FIG. 4b detect the dc output of VGA's $43_I$ and $43_Q$ and feed forward a negative voltage to adders $48_I$ and $48_Q$ in order to remove the dc offset on the output signal before it goes to the next stage in the cascaded structure. Similarly, the feedforward DC compensation circuits $57_I$ and $57_Q$ in FIG. 5b detect the dc output of VGA's $53_I$ and $53_Q$ and feeds forward a negative voltage to adders $58_I$ and $58_Q$ in order to remove the dc offset on the output signal before it goes to the next stage in the cascaded structure.

In most circumstances, DC compensation circuits $46_1$–$46_Q$, $56_I$–$56_Q$, $47_I$–$47_Q$ and $57_I$ and $57_Q$ are not required since the filters $28_1$, $28_2$, ... $28_n$, will filter out the dc. In particular, complex filters will attenuate all signals whether unwanted ac or dc. However, since the dc offsets may differ in the I and Q signals, performance may be improved by removing the respective dc offsets by DC compensation circuits. In this manner, the dc offsets will not be amplified limiting the range of the VGA's for the wanted signals. In addition, DC compensation is particularly important for ZIF since the filters do not attenuate the dc offsets.

Figure 6:
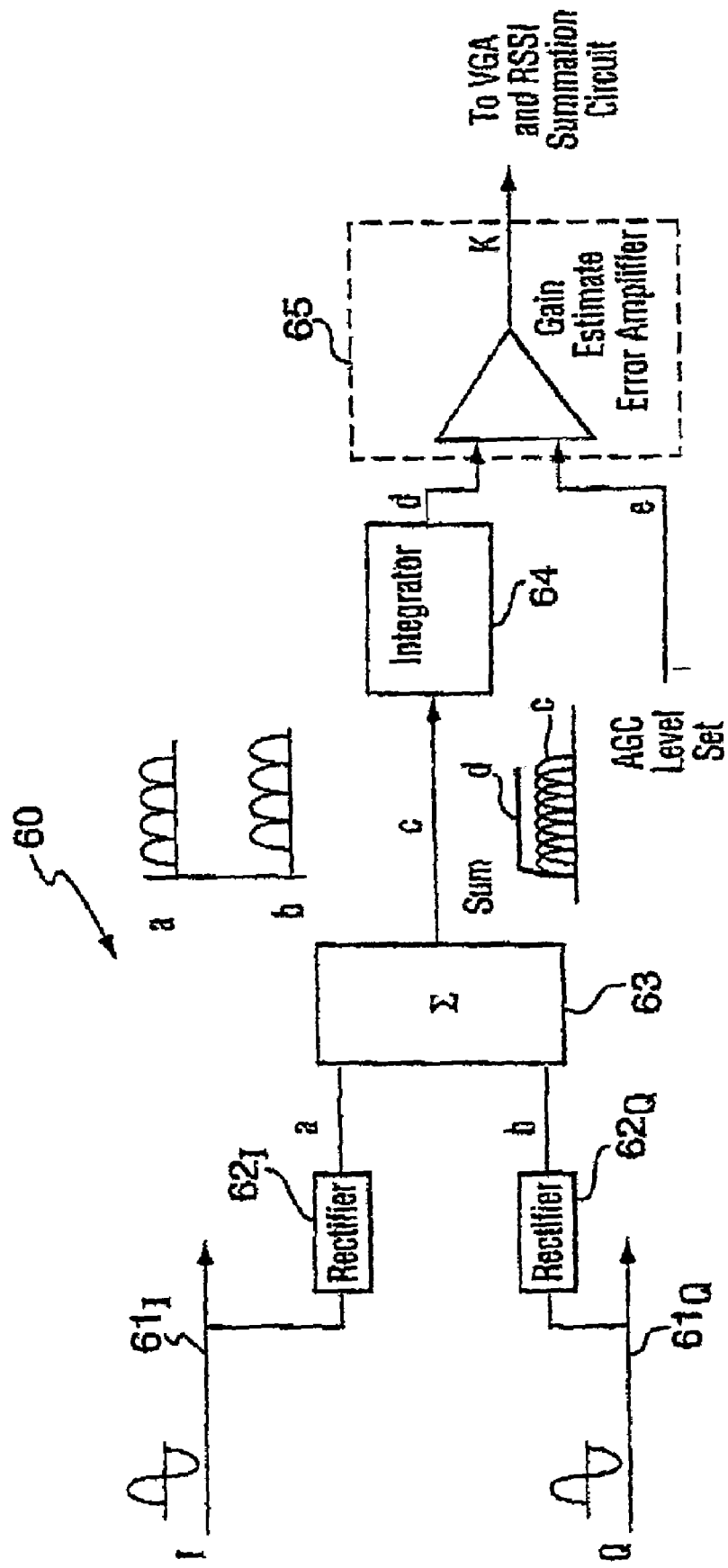
FIG. 6 illustrates a control circuit for the AGC's in accordance with the present invention.

An embodiment of a control circuit 60 which may be used as the control circuit 44, 54 in the embodiments in FIGS. 4a, 4b, 5a, and 5b, is illustrated in FIG. 6. The control circuit 60 in any filtering/AGC stage detects the magnitude of the ac portion of the amplifier input I and Q signals and sets the required gain for that stage. It is important to accurately detect the magnitude of the ac signal and to quickly make the estimate of the magnitude. In this particular embodiment, the in-phase signal I in channel $61_I$ and the quadrature signal Q in channel $61_Q$ are fed to two full wave rectifiers $62_I$ and $62_Q$ respectively providing output signals a and b. Signals a and b are added together in an adder 63 to provide an output c having four amplitude peaks per cycle. This rectifying and summing process provides a greater signal amplitude and a faster peak rise time than would be provided by half wave rectifiers. Since many integrated circuits use differential signalling where the amplifiers are differential amplifiers, it is common to have available in these circuits the in-phase $\overline{I}$ signal and the quadrature signal $\overline{Q}$ phase together with the in-phase I signal and the quadrature phase Q signal. Half-wave rectifying each of the four signals above and summing them would provide the same result as full wave rectifying the I and Q signals.

The signal c is then fed to an integrator 64 which smooths the peaks and holds the summed signal c basically acting as a low pass filter to provide the signal d. Signal d is applied to an error amplifier 65 where it is compared to an AGC projected level signal e to provide the required gain estimate output K which is proportional to the difference between e and d, when e is greater than d. When d is greater than e, then K is negative. In addition, the error amplifier 65 will provide an output signal K which is limited to the predetermined gain range between $K_{max}$ and $K_{min}$ of the AGC in the particular stage that it is operating. Thus $K_{min} \leq K \leq K_{max}$ where $K_{min}$ may be negative. Referring to FIG. 2, the specific signal K in each particular stage $27_1$, $27_2$, ... $27_n$ is used to the control the I and Q VGA's in that particular stage as well as to provide the gain signals $31_1$, $31_2$ ... $31_n$, to the RSSI 32.

If the VGA's are linearly controlled and analog in nature, then the error amplifier 65 may be constructed using an analog circuit such as an op-amp whereby both the inputs and outputs are analog. However, if the VGA's are digitally controlled, then the error amplifier 65 may be constructed using digital logic, with inputs and outputs being digital in nature.

Figure 7:
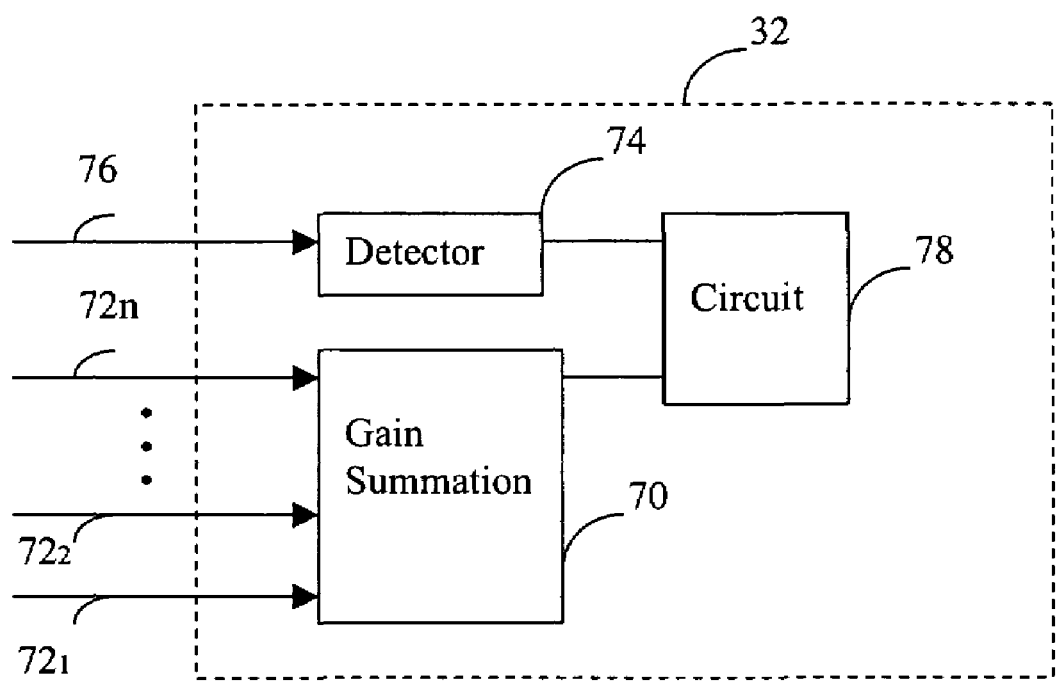
FIG. 7 illustrates an example of a received signal strength indicator (RSSI).

FIG. 7 illustrates an example of the RSSI 32 of FIG. 2. The RSSI 32 of FIG. 7 includes a gain summation circuit 70 for receiving gain control signals $72_1$, $72_2$, ..., $72_n$ from the complex filter/amplifier stages (e.g., $27_1$, $27_2$, ..., $27_n$ of FIG. 2) for computing the overall gain of an apparatus (e.g., 20 of FIG. 2). The RSSI 32 of FIG. 7 further includes a detector 74 for detecting the amplitude of the output signal 76 of the apparatus. The RSSI 32 of FIG. 7 further includes a circuit 78 coupled to the gain summation circuit 70 and the detector 74 for indicating the strength of a desired signal received by the apparatus. The gain control signals $72_1$, $72_2$, ..., $72_n$ may be the actual gains $31_1$, $31_2$, ..., $31_n$ of FIG. 2 or the AGC setting gain control signals such as $15_1$, $15_2$, ..., $15_n$ of FIG. 1, $30_1$, $30_2$, ..., $30_n$ of FIG. 2.

The overall advantage of the present invention is that it provides a stable filtering/amplifier structure which minimizes power consumption. Since it is capable of providing desired output signals having an amplitude level within a restricted dynamic range, further power savings may be achieved in the analog to digital converters and demodulators that follow.

While the invention has been described according to what is presently considered to be the most practical and preferred embodiments, it must be understood that the invention is not limited to the disclosed embodiments. Those ordinarily skilled in the art will understand that various modifications and equivalent structures and functions may be made without departing from the spirit and scope of the invention as defined in the claims. Therefore, the invention as defined in the claims must be accorded the broadest possible interpretation so as to encompass all such modifications and equivalent structures and functions.

What is claimed is:

1. An apparatus for filtering and amplifying a received signal that includes a desired signal portion embedded in an interfering signal portion comprising:
    a plurality of sequentially connected complex filter/amplifier stages, each stage having:
        a complex filter for attenuating an interfering signal portion relative to a desired signal portion of a signal received by the complex filter;
        a controlled amplifier having set minimum gain $K_{min}$ and maximum gain $K_{max}$ for amplifying the desired signal portion and the interfering signal portion of the signal received from the complex filter; and
        a control circuit for controlling a gain K of the controlled amplifier in the complex filter/amplifier stage where $K_{min} \leq K \leq K_{max}$ such that the controlled amplifier seeks to generate the desired signal of the signal received from the complex filter, the desired signal having a projected amplitude level at the controlled amplifier output, wherein the apparatus provides an output of the last stage of the complex filter/amplifier as the desired signal of the received signal at a predetermined signal level at the apparatus output as a result of a combined gain of the controlled amplifiers of the plurality of the complex filter/amplifier stages.

2. An apparatus as claimed in claim 1 wherein the received signal is in the intermediate frequency (IF) band.

3. An apparatus as claimed in claim 2 wherein the received signal is at a low intermediate frequency (LIF).

4. An apparatus as claimed in claim 2 wherein the received signal is at a substantially zero intermediate frequency (ZIF).

5. An apparatus as claimed in claim 1 wherein in each of the complex filter/amplifier stages, the complex filter filters the signal received at its input to generate a filtered received signal, and the controlled amplifier is connected to the filter to amplify the filtered received signal.

6. An apparatus as claimed in claim 1 wherein the received signal comprises complex in-phase I and quadrature phase Q signals.

7. An apparatus as claimed in claim 6 wherein each of the complex filters includes up to two poles.

8. An apparatus as claimed in claim 6 wherein each of the complex filters comprises one or more single pole complex filters connected in series.

9. An apparatus as claimed in claim 6 wherein each of the controlled amplifiers comprises:
- a first variable gain amplifier for amplifying the in-phase I signal; and
- a second variable gain amplifier for amplifying the quadrature phase Q signal, wherein the control circuit generates a gain control signal for controlling the gain of the first and second amplifiers.

10. An apparatus as claimed in claim 9 wherein the control circuit determines the control signal as a function of the I and Q inputs to the amplifiers.

11. An apparatus as claimed in claim 9 wherein the control circuit determines the control signal as a function of the I and Q outputs of the amplifiers.

12. An apparatus as claimed in claim 9 wherein the control circuit determines the control signal as a function of the projected amplitude level.

13. An apparatus as claimed in claim 9 wherein the control circuit comprises:
- a first rectifier for receiving the output of the first variable gain amplifier to provide a first rectified signal;
- a second rectifier for receiving the output of the second variable gain amplifier to provide a second rectified signal;
- an adder for adding the first and the second rectified signals; and
  - an error amplifier having a first input coupled to the adder and a second input coupled to a projected amplitude level signal for producing the gain control signal.

14. An apparatus as claimed in claim 13 wherein the first and second rectifiers are full wave rectifiers.

15. An apparatus as claimed in claim 9 wherein the control circuit comprises:
- a first rectifier for receiving the input of the first variable gain amplifier to provide a first rectified signal;
- a second rectifier for receiving the input of the second variable gain amplifier to provide a second rectified signal;
- an adder to add the first and the second rectified signals; and
- an error amplifier having a first input coupled to the adder and a second input coupled to a projected amplitude level signal for producing the gain control signal.

16. An apparatus as claimed in claim 15 wherein the first and second rectifiers are full wave rectifiers.

17. An apparatus as claimed in claim 9 further comprising:
- a received signal strength indicator having:
  - a gain summation circuit for receiving the gain control signal from each of the complex filter/amplifier stages for computing the overall gain of the apparatus;
  - a detector for detecting an amplitude of the apparatus output signal; and
  - a circuit coupled to the gain summation circuit and the detector for indicating the strength of a desired signal received by the apparatus.

18. An apparatus as claimed in claim 1 wherein each complex filter/amplifier stage further includes a dc compensation circuit for attenuating the dc offset of the signal received by the complex filter/amplitude.

19. An apparatus as claimed in claim 18 wherein the dc compensation circuit is a feedback circuit.

20. An apparatus as claimed in claim 18 wherein the dc compensation circuit is a feedforward circuit.

21. An apparatus as claimed in claim 1 wherein $K_{min}$ is negative.

22. An apparatus for filtering and amplifying a complex in-phase I and quadrature phase Q received signals, comprising a plurality of sequentially connected complex filter/amplifier stages, each stage having:
- complex filter means for attenuating an interfering portion relative to a desired portion of signals received by the complex filter means;
- controlled amplifier means having set minimum gain $K_{min}$ and maximum gain $K_{max}$ for amplifying the signals received from the complex filter means, said signals received from the complex filter means including an in-phase I signal and a quadrature phase Q signal, the controlled amplifier means comprising:
  - a first variable gain amplifier for amplifying the in-phase I signal; and
    - a second variable gain amplifier for amplifying the quadrature phase Q signal; and,
- control means for generating a gain control signal for controlling a gain K of the first and second amplifiers where $K_{min} \leq K \leq K_{max}$ such that the controlled amplifiers seek to generate output signals having a projected amplitude level, wherein the control means comprises:
  - a first rectifier for receiving the output of the first variable amplifier to provide a first rectified signal;
  - a second rectifier for receiving the output of the second variable amplifier to provide a second rectified signal;
  - summing means for adding the first and the second rectified signals; and
  - error amplifier means having a first input coupled to the summing means and a second input coupled to a projected amplitude level signal for producing the gain control signal.

23. An apparatus as claimed in claim 22 wherein the first and second rectifiers are full wave rectifiers.

24. An apparatus as claimed in claim 22 wherein $K_{min}$ is negative.

25. An apparatus for filtering and amplifying a complex in-phase I and quadrature phase Q received signals, comprising a plurality of sequentially connected complex filter/amplifier stages, each stage having:
- complex filter means for attenuating an interfering portion relative to a desired portion of signals received by the complex filter means;
- controlled amplifier means having set minimum gain $K_{min}$ and maximum gain $K_{max}$ for amplifying the signals received from the complex filter means, said signals received from the complex filter means including an in-phase I signal and a quadrature phase Q signal, the controlled amplifier means comprising:
  - a first variable gain amplifier for amplifying the in-phase I signal; and
    - a second variable gain amplifier for amplifying the quadrature phase Q signal; and,
- control means for generating a gain control signal for controlling a gain K of the first and second amplifiers where $K_{min} \leq K \leq K_{max}$ such that the controlled amplifiers seek to generate output signals having a projected amplitude level, wherein the control means comprises:
  - a first rectifier for receiving the input of the first variable amplifier to provide a first rectified signal;

a second rectifier for receiving the input of the second variable amplifier to provide a second rectified signal;

summing means for adding the first and the second rectified signals; and error amplifier means having a first input coupled to the summing means and a second input coupled to a projected amplitude level signal for producing the gain control signal.

26. An apparatus as claimed in claim 25 wherein the first and second rectifiers are full wave rectifiers.

27. An apparatus for filtering and amplifying a complex in-phase I and quadrature phase Q received signals, comprising a plurality of sequentially connected complex filter/amplifier stages, each stage having:

complex filter means for attenuating an interfering portion relative to a desired portion of signals received by the complex filter means;

controlled amplifier means having set minimum gain $K_{min}$ and maximum gain $K_{max}$ for amplifying the signals received from the complex filter means, said signals received from the complex filter means including an in-phase I signal and a quadrature phase Q signals, the controlled amplifier means comprising:

a first variable gain amplifier for amplifying the in-phase I signal; and a second variable gain amplifier for amplifying the quadrature phase Q signal;

control means for generating a gain control signal for controlling a gain K of the first and second amplifiers where $K_{min} \leq K \leq K_{max}$ such that the controlled amplifiers seek to generate output signals having a projected amplitude level; and a received signal strength indicator comprising:

gain summation means for receiving the gain control signal from each of the complex filter/amplifier stages for computing the overall gain of the apparatus;

means for detecting an amplitude of the apparatus output signal; and means coupled to the gain summation means and the detector means for indicating the strength of a desired signal received by the apparatus.

* * * * *